United States Patent [19]

Sakaguchi et al.

[11] 4,223,395
[45] Sep. 16, 1980

[54] VOLATILE MEMORY HOLD DEVICE

[75] Inventors: Shunichi Sakaguchi, Nagaokakyo; Kiyohide Okamoto, Ohtsu, both of Japan

[73] Assignee: Omron Tateisi Electronics Co., Kyoto, Japan

[21] Appl. No.: 951,397

[22] Filed: Oct. 16, 1978

[51] Int. Cl.² .............................................. G11C 13/00
[52] U.S. Cl. ................................... 365/229; 307/238
[58] Field of Search ............... 365/229, 189; 307/238, 307/150

[56] References Cited

U.S. PATENT DOCUMENTS

| 3,117,254 | 1/1964 | Luce | 317/141 |
| 3,859,638 | 1/1975 | Hume | 365/229 |
| 3,980,935 | 9/1976 | Worst | 365/229 |
| 4,122,359 | 10/1978 | Breikss | 365/229 |

Primary Examiner—Terrell W. Fears
Attorney, Agent, or Firm—Stevens, Davis, Miller & Mosher

[57] ABSTRACT

A volatile memory hold device comprising power terminals to which a power source is connectable, a volatile memory connected to the power terminals which serves as input power terminals therefor, and a charge-and-discharge circuit connected to the power terminal in parallel with the memory, the charge-and-discharge circuit including a capacitor which is charged by the power for the volatile memory and to supply the memory with the power discharged therefrom, whereby the memory retains stored data even when power supplied from the power source is no longer available.

9 Claims, 7 Drawing Figures

VOLATILE MEMORY HOLD DEVICE

BRIEF SUMMARY OF THE INVENTION

The present invention relates to a volatile memory hold device which retains stored data even when the power supply from the power source is no longer available, and more particularly to a volatile memory hold device wherein a volatile memory is supplied with discharge power from a capacitor when the power supply from the power source is no longer available.

Modern electronic systems such as electronic cash registers each comprise a logic board including an arithmetic unit and a memory board including a plurality of volatile memories which are C MOS RAMs (complementary metal-oxide-semiconductor random-access-memories). Generally, the volatile memory, such as C MOS RAM, has the disadvantage that the data stored in the memory are volatilized when the power supply thereto is cut off, e.g., by an interruption of electric power service. As is well known, a supplemental battery is provided to obviate this disadvantage. Such a supplemental battery is connected to the memory to prevent destruction of stored data when the power from the power source is no longer available. There still remains a problem, however, in that to retain the stored data, the memory board must be maintained in electrical communication with the supplemental battery even on dismounting of the memory board and this requirement means a considerable inconvenience in maintenance service.

It is, therefore, a primary object of this invention to provide a volatile hold memory device which is simple in construction and which prevents stored data in a volatile memory from being volatilized even when the power supplied thereto is no longer available.

It is another object of this invention to provide a volatile memory hold device which comprises a capacitor which is charged by the power for the volatile memory and which supplies the memory with the power discharged therefrom.

It is still another object of this invention to provide a volatile memory hold device which holds stored data in the memory for many hours after the power supplied to the memory becomes unavailable.

It is another yet object of this invention to provide a volatile memory hold device which comprises a display which provides an indication when the power supplied to the memory is below a minimum operational power for the volatile memory.

According to one aspect of this invention, there is provided a volatile memory hold device comprising power terminals to which a power source is connectable, a volatile memory connected to said power terminals which serves as input power terminals therefor, and a charge-and-discharge circuit connected to the power terminal in parallel with the memory, the charge-and-discharge circuit including a capacitor which is charged by the power for the volatile memory and which supplies the memory with the power discharged therefrom, whereby the memory retains stored data even when the power supply from the power source is no longer available.

Other object as well as the numerous advantages of the volatile memory hold device according to this invention will become apparent from the following detailed description of the invention and the accompanying drawings.

DETAILED DESCRIPTION

Figure 1:
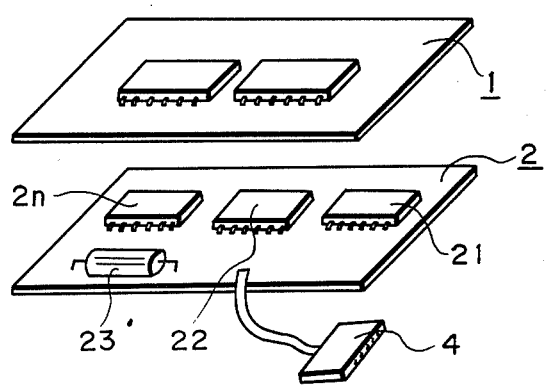
FIG. 1 is a perspective view showing logic and memory boards embodying the principles of this invention.

Referring, now, to FIG. 1, there is shown a logic and a memory board embodying the principles of this invention. An arithmetic board 1 and a memory board 2, which constitute parts of an electronic system, are separable for maintenance service. The memory board 1 includes volatile memories 21, 22 . . . 2n, a capacitor 23 and a connector 4, the connector 4 being connectable to a power source. According to this invention, the memory board 2 retains stored data in the volatile memories 21, 22 . . . 2n for a predetermined time period even when the board 2 alone is disconnected from the power source (not shown).

Figure 2:
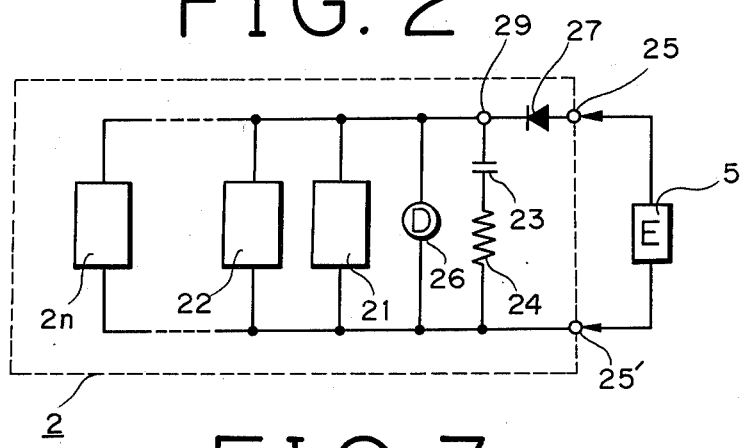
FIG. 2 is a schematic diagram of a volatile memory hold device embodying the principles of this invention.

FIG. 2 is a schematic diagram showing one embodiment of the volatile memory hold device according to this invention, which comprises a power source 5, power terminals 25 and 25', a diode 27, a capacitor 23, a resistor 24, a display 26, and volatile memories 21, 22 . . . 2n. The mode of operation will hereinafter be explained, reference being made to this schematic diagram. As the power source 5 supplies power terminals 25 and 25' with power, the power thus supplied charges the capacitor 23 through the diode 27 and the resistor 24, and, thence, energizes the memories 21 to 2n. When the power supply from the power source 5 is discontinued by disconnection of the source 5 from the terminals 25 and 25' or a malfunction of the source 5 such as an interruption of electric power service, the capacitor 23 begins to discharge and supply the memories 21 to 2n with the discharge power therefrom to keep the memories 21 to 2n within the operating region thereof as long as the capacitor 23 holds a charged power at a level higher than a predetermined power level. The display 26 indicates that the power supplied to the memories 21 to 2n is below a workable power level when the capacitor 23 charge is below the predetermined power level. A field effect type liquid crystal display or an electrochronic device is suitable for the display 26, since it requires only a very small operating current. It has been confirmed on examination that C MOS 8K-bits-RAM having 16 chips requires 80 $\mu$A when the RAM changes the stored data, i.e., in dynamic status, but the RAM requires only 1 $\mu$A when the stored data are not changed, i.e. static status. Accordingly, if capacitor 23 has a capacity value of 1000 μF, it allows the memories 21 to 2n in static status to retain stored data for more than 24 hours. In other words, it is possible to retain stored data in memories when the memory board 2 is disconnected from an associated electronic system for more than 24 hours. The period of 24 hours is sufficient for usual maintenance service. The diode 27 is provided for the purpose of blocking the flow of an electric current from the capacitor 23 to the terminals 25 and 25'. The diode 27 prevents the capacitor 23 from instantly discharging through any external low impedance load across the terminals 25 and 25'. The external low impedance load may arise from a malfunction of the power source 5 or a short connection between terminals 25 and 25'. The resistor 24 is designed with a resistance rating such that on saturation of the memories 21 to 2n, the discharge current from the capacitor 23 brings the memories 21 to 2n into a cut-off region. If the memories 21 to 2n are saturated with an external noise in the absence of a power supply from the source 5, the discharge current from the capacitor 23 is urged to flow to the memories as a rush current (about 10 mA). However, such a rush current is effectively blocked by the resistor 24 which, as noted, has a high rated resistance.

The resistor 24 returns the memories 21 to 2n into the operating region from the saturating region without a large consumption of the discharge power from the capacitor 23. This automatic return of the memories 21 to 2n into the normal operating region prevents an error when stored data in the memories are processed again. The display 26 also indicates if stored data are properly retained in the memories 21 to 2n which are supplied by the discharge power from the capacitor 23, and prevents error in data processing when the memory board 2 having memories 21 to 2n is again mounted in an associated electronic system.

Figure 3:
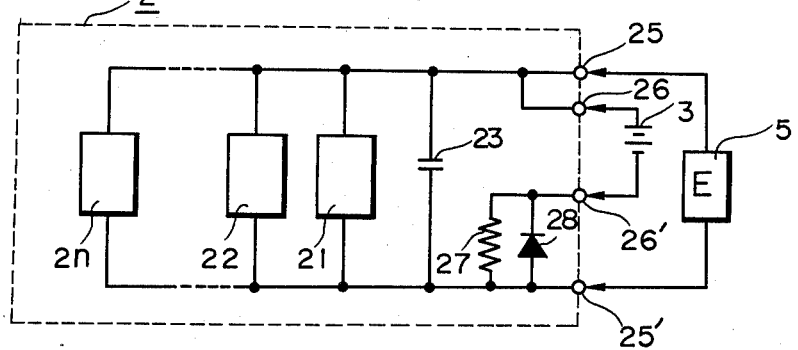
FIG. 3 is a schematic diagram of another embodiment of the volatile memory hold device according to this invention.

FIG. 3 is a schematic diagram showing another embodiment of the volatile memory hold device, which includes a rechargeable battery 3 as a supplemental power source of the source 5, battery terminals 26 and 26', a diode 28 and a resistor 27. The battery 3 is charged through the resistor 27 by the power from the source 5, and discharges through the diode 28 and memories 21 and 2n when the power from the source 5 is not available. The capacitor 23 will supply the memories 21 to 2n with the discharge power when the power from the source 5 and battery 3 are both no longer available.

Figure 4:
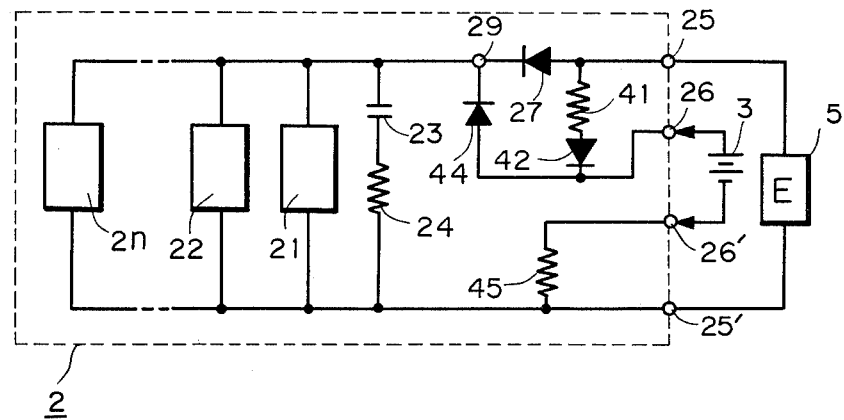
FIG. 4 is a schematic diagram of another embodiment of the volatile memory hold device according to this invention.

FIG. 4 is a schematic diagram of another embodiment of a volatile memory hold device which is an improvement over the device of FIG. 3. The rechargeable battery 3 is charged through resistor 41, a diode 42 and a resistor 45 by the power from the source 5. The battery 3 discharges through a diode 44, memories 21 to 2n and resistor 45. The resistor 24 and the diode 27 have the same function and effects as in FIG. 2.

Figure 5:
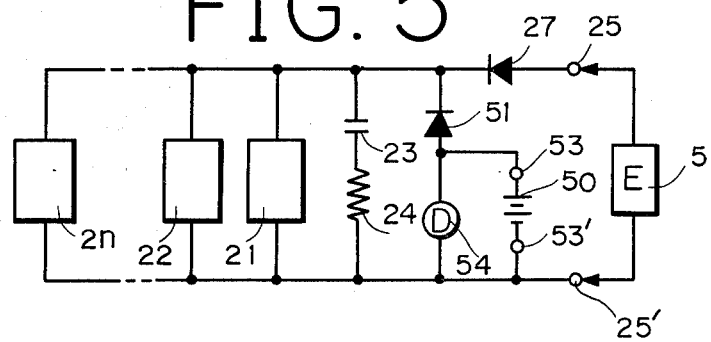
FIG. 5 is a schematic diagram of another embodiment of the volatile memory hold device including a non-rechargeable battery according to this invention.

FIG. 5 is a schematic diagram of another embodiment of a volatile memory hold device which includes a non-rechargeable battery 50. The voltage of the battery 50 is set to be below the voltage of the source 5. The diode 51 blocks the flow of a current from the source 5 to the battery 50 and causes the battery 50 to supply memories 21 to 2n with the discharge power thereof when the power from the source 5 is no longer available. It will be apparent that the capacitor 23 supplies memories 21 to 2n with the discharge power from the capacitor 23 when the power from the source 5 and the battery 50 are both unavailable. A display 54 will indicate that the voltage of the battery 50 is below a predetermined level and the battery must then be replaced.

Figure 6:
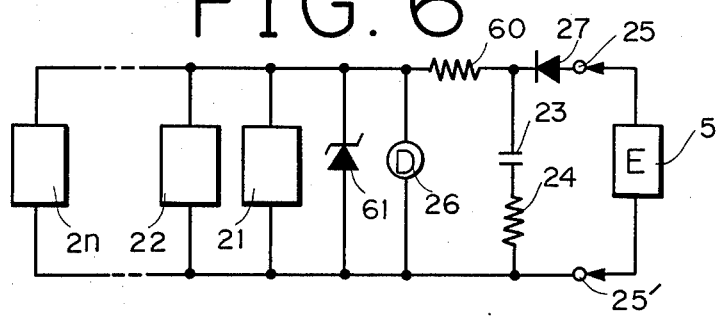
FIG. 6 is a schematic diagram of another embodiment of the volatile memory hold device utilizing a Zener diode according to this invention.
Figure 7:
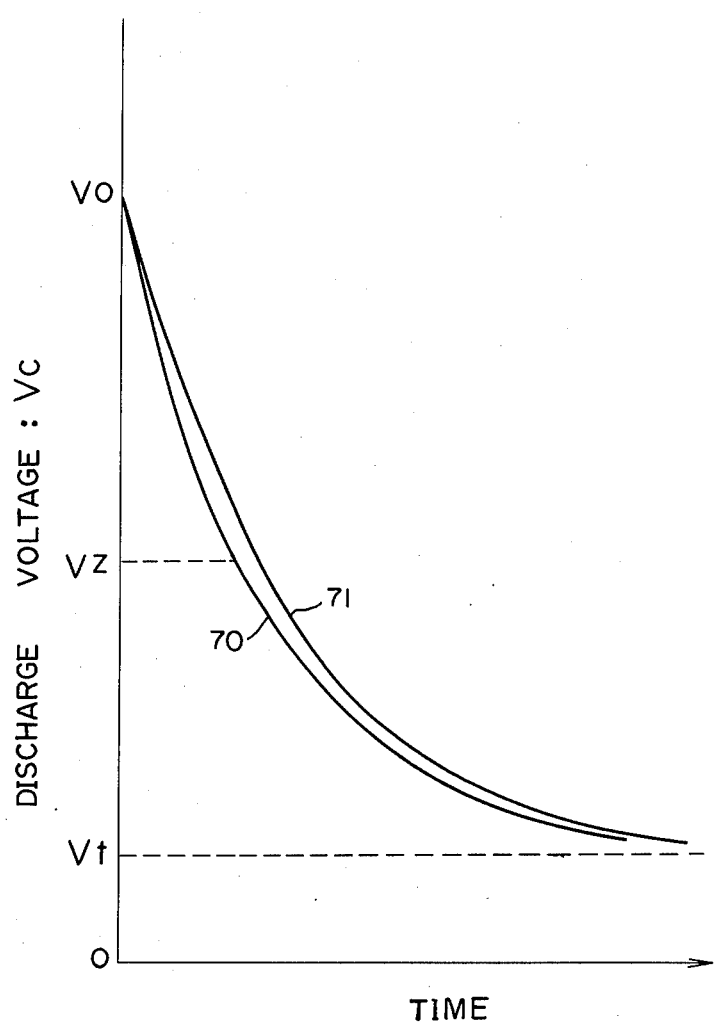
FIG. 7 is a graph showing a curve of discharge voltage of the capacitor associated with the device of FIG. 6.

FIG. 6 is a schematic diagram of another embodiment of the volatile memory hold device according to this invention which includes a Zener diode 61 and a resistor 60, in addition to power source 5, terminals 25 and 25', capacitor 23, resistor 24, display 26 and memories 21 to 2n. FIG. 7 is a graph for explaining the embodiment of FIG. 6 which shows a discharge voltage appearing across the two electrodes of the capacitor 23. In normal operation, the rated voltage Vo of the power source 5 drops through a voltage drop resistor 60 to a predetermined voltage Vz which is dictated by the Zener voltage of the Zener 61 and is above the minimum operating supply voltage for the memories 21 to 2n. The resistor 60 has a low resistance to allow the diode 61 and memories 21 and 2n to work. The capacitor 23 is charged up to the same voltage level as Vo. When the power supply from the power source 5 is not available, the capacitor 23 starts discharging along the curve 70 in FIG. 7. The curve 71 is an exponential curve which the capacitor 23, without load, will trace. The resistor 24 has a sufficient resistance to allow a sufficient current to be supplied to the memories 21 to 2n to retain stored data therein. The voltage Vc appearing across the two electrodes of the capacitor 23 drops rather sharply to Vz from Vo since some current flows to the Zener diode 61 from the capacitor 23 as long as the voltage Vc is over the Zener voltage. But the subsequent discharge curve of the capacitor 23 below the voltage Vz shows a slowing of the discharge since there is no current through the diode 61 from the capacitor 23 and the discharge current is only applied to the memories 21 to 2n in the order of micro amperes which is very close to a natural discharge current of the capacitor 23. Consequently, the time period before the voltage Vc drops to the voltage Vt where the discharge curve 70 is flattened may be fairly extended. The voltage Vt is set to be above the minimum operational supply voltage of memories 21 to 2n. According to this embodiment, therefore, the volatile memory hold device may retain stored data therein by the capacitor discharge alone for many more hours than the period which is obtained by any of the preceeding embodiments.

According to one aspect of this invention, a volatile memory is supplied with sufficient power to retain stored data therein for many hours even when a sustained interruption of power service takes place or the power supply from a power source including a supplemental power source such as a battery is not available.

It should be understood that the above description is merely illustrative of this invention and that many changes and modifications may be made by those skilled in the art without departing from the scope of the appended claims.

What is claimed is:

1. A volatile memory hold device comprising power terminals to which a power source is connectable, a volatile memory connected to said power terminals, the latter serving as input power terminals for said volatile memory, and a charge-and-discharge circuit connected across said power terminals in parallel with said memory, said charge-and-discharge circuit including a capacitor and a first resistor connected in series with said capacitor, said capacitor being charged by power for said volatile memory supplied over said power terminals and supplying said memory with power discharged therefrom, said resistor having a resistance value which prevents application of a rush current to said memory from said capacitor, said charge-and discharge circuit enabling said memory to retain stored data even when the power supply from said power source is no longer available.

2. A volatile memory hold device according to claim 1 further comprising first diode for blocking the flow of a current from said charge-and-discharge circuit to said power terminals, said memory and said charge-and-discharge circuit being connected through said first diode across said power terminals.

3. A volatile memory hold device according to claim 1 further comprising a supplemental power source circuit having a battery, the discharge power of which is applied to said memory when no power is available from said power source to said power terminals, said capacitor supplying said memory with its discharge power when no power is available from either said power source or said supplemental power source circuit.

4. A volatile memory hold device according to claim 3, wherein said battery is a rechargeable battery which is charged by said power source.

5. A volatile memory hold device according to claim 3, wherein said supplemental power source further comprises a second diode for blocking the flow of a current from said power source to said battery and said battery is nonrechargeable.

6. A volatile memory hold device according to claim 3 further comprising a third diode for blocking the flow of a current from said charge-and-discharge circuit to said supplemental power source.

7. A volatile memory hold device according to claim 1 further comprising a display for indicating that the power supplied to said memory is below a minimum operational power for said volatile memory.

8. A volatile memory hold device according to claim 1 further comprising a Zener diode and a third resistor, said memory being connected in parallel with said Zener diode and through said third resistor to one of said power terminals, the Zener voltage of said Zener diode being less than a maximum allowable supply voltage of said memory, said capacitor being charged by said power source to a voltage which maintains said memory in an operational region even when the exponential slope of the discharge voltage supplied to said memory from said capacitor flattens after said capacitor starts discharging.

9. A volatile memory hold device according to claim 1, wherein said volatile memory is a C-MOS RAM.

* * * * *